United States Patent [19]
Sandhu et al.

[11] Patent Number: 5,654,222
[45] Date of Patent: Aug. 5, 1997

[54] METHOD FOR FORMING A CAPACITOR WITH ELECTRICALLY INTERCONNECTED CONSTRUCTION

[75] Inventors: Gurtej S. Sandhu; Paul Schuele; Wayne Kinney, all of Boise, Id.

[73] Assignee: Micron Technology, Inc., Boise, Id.

[21] Appl. No.: 442,837

[22] Filed: May 17, 1995

[51] Int. Cl.$^6$ .............................. H01L 21/70; H01L 27/00
[52] U.S. Cl. .................. 438/3; 438/396; 438/397
[58] Field of Search .............................. 437/52, 60, 919, 437/303, 306–310

[56] References Cited

U.S. PATENT DOCUMENTS 5,053,351  10/1991  Fazan et al. ........................... 437/52
5,102,820  4/1992  Chiba ................................... 437/52

OTHER PUBLICATIONS

Onishi, Shigeo et al., "A Half–Micron Ferroelectric Memory Cell Technology with Stacked Capacitor Structure", IEEE, 1994, pp. 843–846.
Lesaicherre, P–Y et al., "A Gbit–Scale DRAM Stacked Technology With ECR MOCVD SrTiO$_3$ and RIE Patterned RuO$_2$/TiN Storage Node", IEEE, 1994, pp. 831–834.
Eimori, T. et al., "A Newly Designed Planar Stacked Capacitor Cell With High Dielectric Constant Film for 256Mbit DRAM", IEEE, 1993, pp. 631–634.

Primary Examiner—Jey Tsai
Attorney, Agent, or Firm—Wells, St. John, Roberts, Gregory & Matkin, P.S.

[57] ABSTRACT

A method of forming a capacitor includes, a) providing a node to which electrical connection to a capacitor is to be made; b) providing an electrically conductive first layer over the node; c) providing an electrically insulative barrier second layer over the first conductive layer; d) providing a third layer over the electrically insulative barrier layer, the third layer comprising a material which is either electrically conductive and resistant to oxidation, or forms an electrically conductive material upon oxidation; e) providing an insulating inorganic metal oxide dielectric layer over the electrically conductive third layer; f) providing an electrically conductive fourth layer over the insulating inorganic metal oxide dielectric layer; and g) providing an electrically conductive interconnect to extend over the second insulative layer and electrically interconnect the first and third conductive layers. A capacitor construction having such a dielectric layer in combination with the barrier layer and electrical interconnect of a first capacitor plate is disclosed.

23 Claims, 17 Drawing Sheets

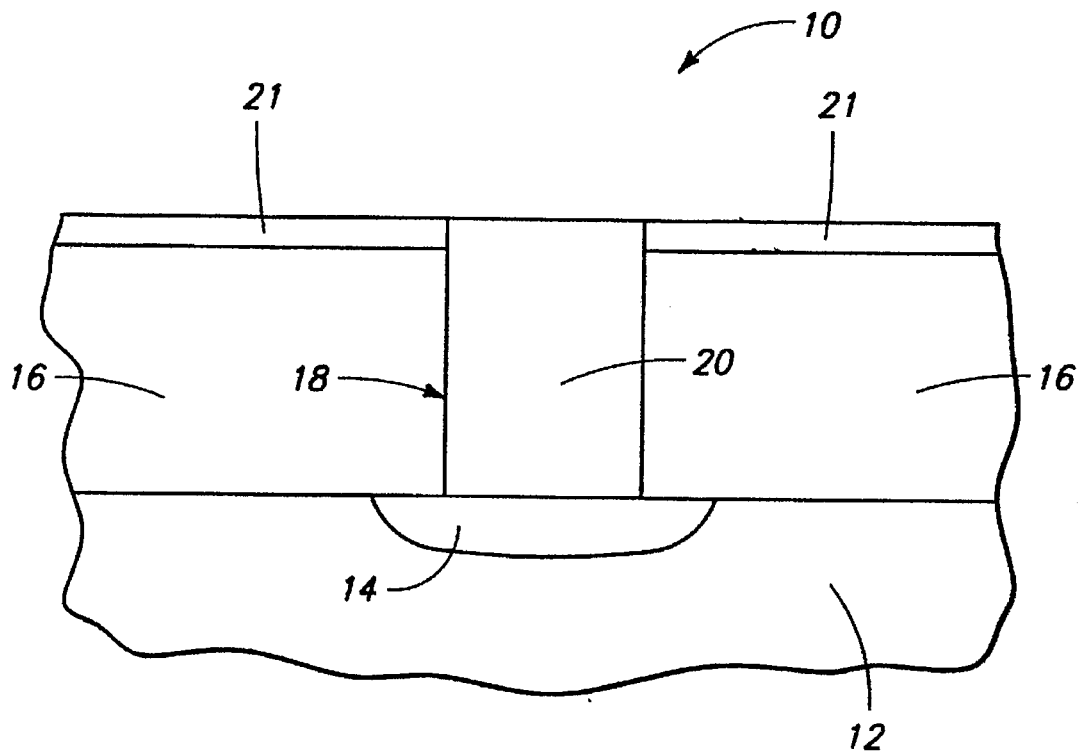
$\mathbf{F} \mathbf{I} \mathbf{G} \mathbf{I}$
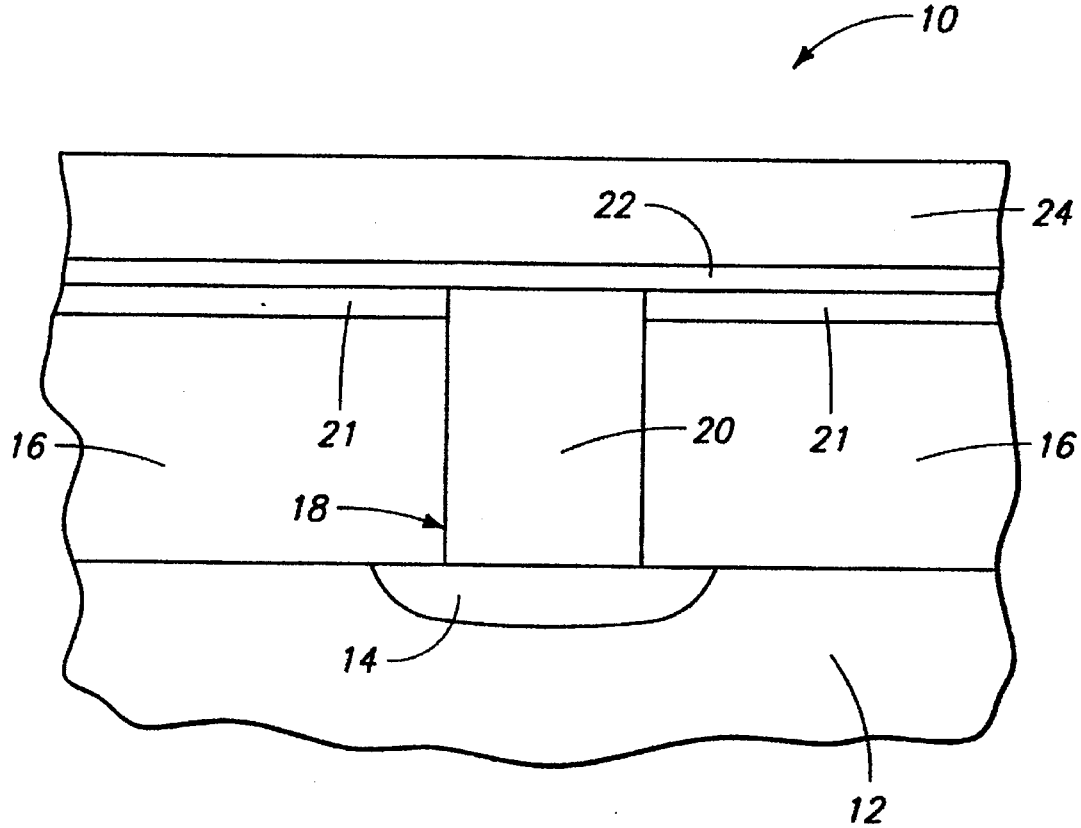
$\mathbf{F} \mathbf{I} \mathbf{G} \mathbf{2}$

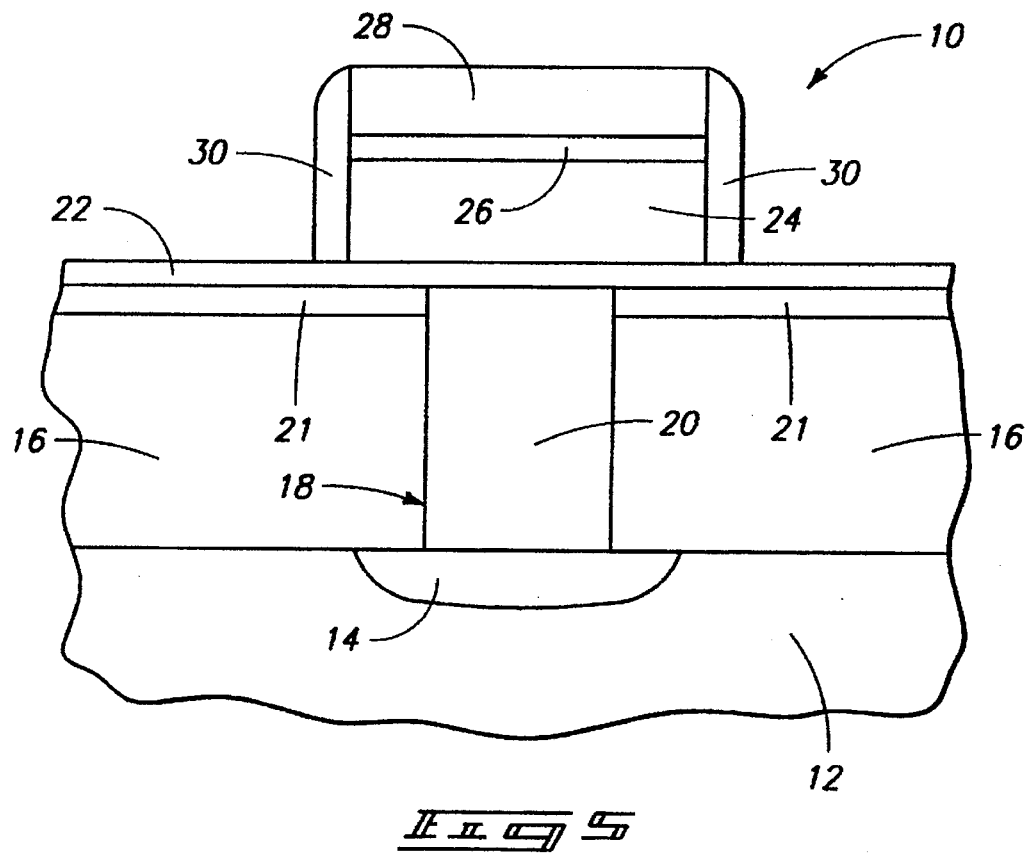
F I G 5
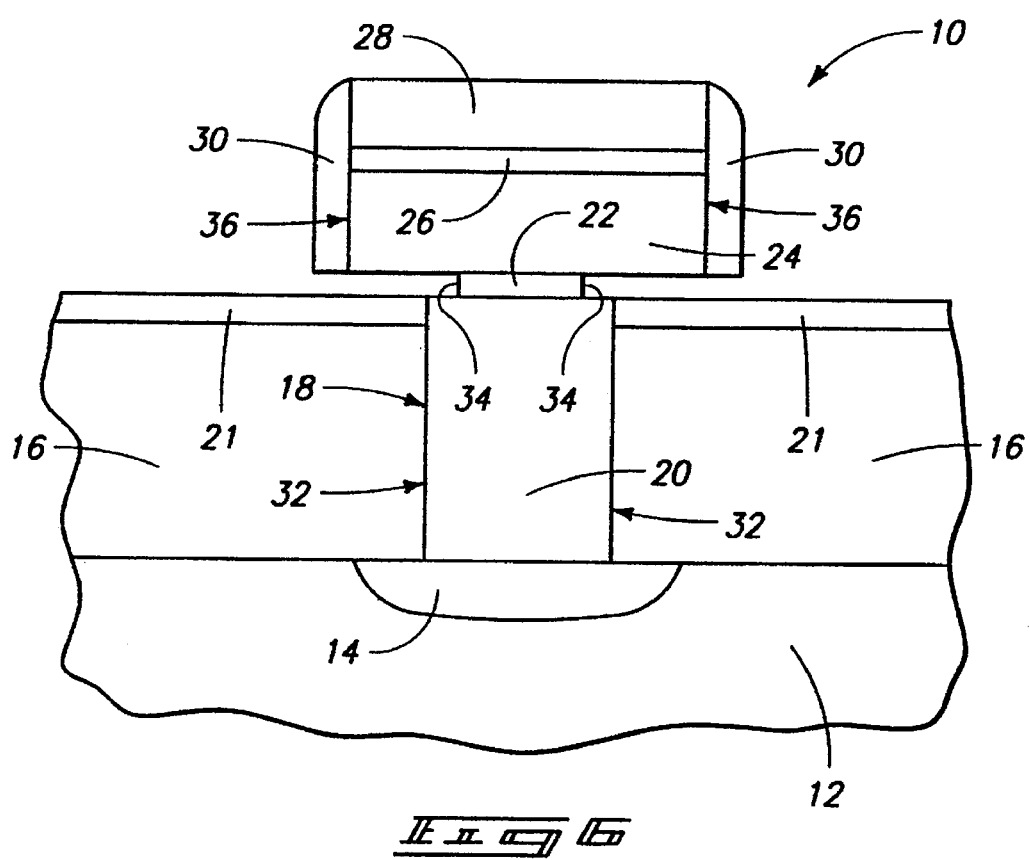
F I G 6

5,654,222

METHOD FOR FORMING A CAPACITOR WITH ELECTRICALLY INTERCONNECTED CONSTRUCTION

PATENT RIGHTS INFORMATION

This invention was made with U.S. Government support under Contract Nos. MDA972-94-C0006 and MDA972-93-C-0033 awarded by the Advanced Research Projects Agency (ARPA). The U.S. Government has certain rights in this invention.

TECHNICAL FIELD

This invention relates generally to semiconductor processing methods of forming capacitors, and to capacitor constructions.

BACKGROUND OF THE INVENTION

Insulating inorganic metal oxide materials, such as ferroelectric materials or perovskite material, have high dielectric constants and low leakage current which make them attractive as cell dielectric materials for high density DRAMs and non-volatile memories. Perovskite material and other ferroelectric materials exhibit a number of unique and interesting properties. One such property of a ferroelectric material is that it possesses a spontaneous polarization that can be reversed by an applied electric field. Specifically, these materials have a characteristic temperature, commonly referred to as the transition temperature, at which the material makes a structural phase change from a polar phase (ferroelectric) to a non-polar phase, typically called the paraelectric phase.

Despite the advantages of high dielectric constants and low leakage, insulating inorganic metal oxide materials suffer from many drawbacks. For example, all of these materials may incorporate oxygen or are otherwise exposed to oxygen for densification to produce the desired capacitor dielectric layer. Unfortunately, the provision of such layers or subjecting such layers to oxidation densification also undesirably oxidizes the underlying bottom or lower storage node plate, which is typically conductively doped polysilicon. The art accepted solution to this problem is to provide an intervening oxidation barrier layer between the underlying conductive polysilicon and overlying insulating inorganic metal oxide dielectric layer. This layer must accordingly be electrically conductive, as the underlying polysilicon must be in electrical connection with the insulating inorganic metal oxide dielectric layer.

Unfortunately, there are a limited number of oxidation barrier materials which are conductive. Elemental platinum (a conductive oxidation barrier) on polysilicon has been suggested as a composite layer or construction for a lower capacitor plate, but undergoes physical degradation with thermal cycling due to silicon diffusion through the platinum. Sputtered TiN and CVD TiN (other conductive barriers) have been known to fail due to diffusion along grain boundaries.

It would be desirable to overcome some of these prior art drawbacks in developing a method and capacitor construction which enables utilization of insulating inorganic metal oxide materials as capacitor dielectric layers.

BRIEF DESCRIPTION OF THE DRAWINGS

Preferred embodiments of the invention are described below with reference to the following accompanying drawings.

FIG. 1 is a diagrammatic cross sectional view of a semiconductor wafer fragment at one processing step in accordance with the invention.

FIG. 2 is a view of the FIG. 1 wafer at a processing step subsequent to that shown by FIG. 1.

FIG. 5 is a view of the FIG. 1 wafer at a processing step subsequent to that shown by FIG. 4.

FIG. 6 is a view of the FIG. 1 wafer at a processing step subsequent to that shown by FIG. 5.

DETAILED DESCRIPTION OF THE PREFERRED EMBODIMENTS

Figure 3:
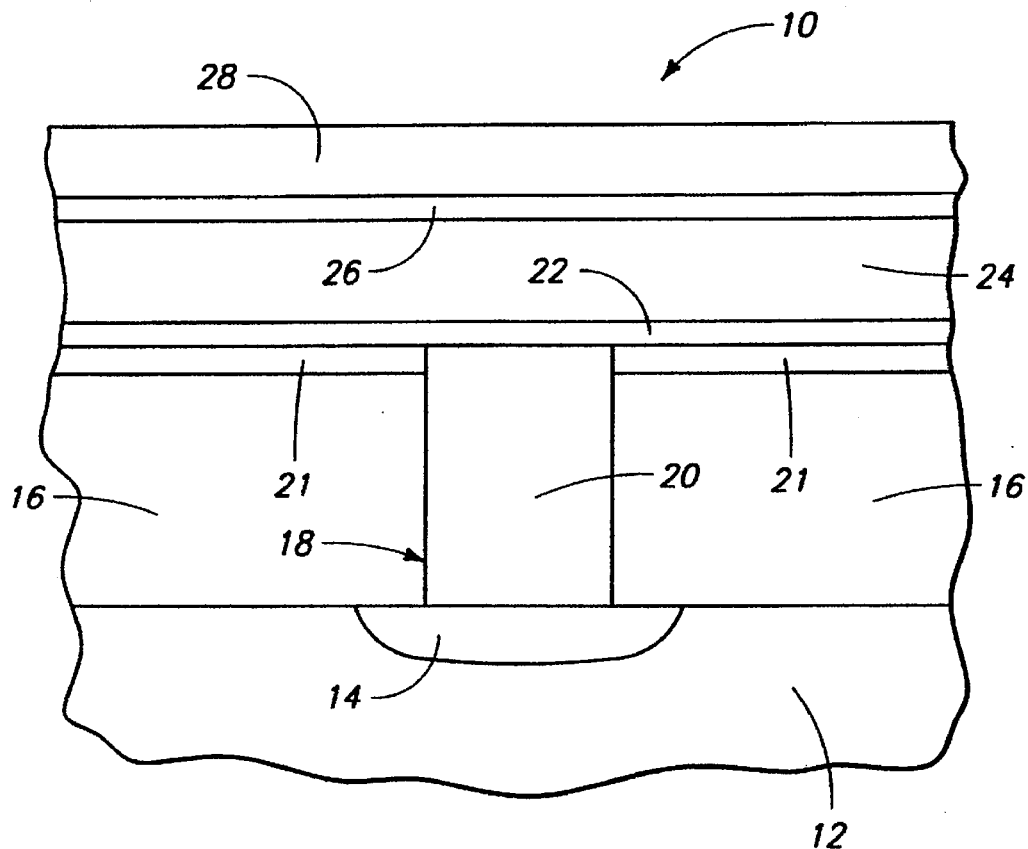
FIG. 3 is a view of the FIG. 1 wafer at a processing step subsequent to that shown by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor comprises the following steps:

providing a node to which electrical connection to a capacitor is to be made;

providing an electrically conductive first layer over the node;

providing an electrically insulative barrier second layer over the first conductive layer;

providing a third layer over the electrically insulative barrier layer, the third layer comprising a material which is either electrically conductive and resistant to oxidation, or forms an electrically conductive material upon oxidation;

providing an insulating inorganic metal oxide dielectric layer over the electrically conductive third layer;

providing an electrically conductive fourth layer over the insulating inorganic metal oxide dielectric layer; and providing an electrically conductive interconnect to extend over the second insulative layer and electrically interconnect the first and third conductive layers.

In accordance with another aspect of the invention, a capacitor comprises:

a first capacitor plate;

a second capacitor plate;

an insulating inorganic metal oxide dielectric layer interposed between the first and second capacitor plates;

the first capacitor plate comprising a composite construction of at least three layers; the three layers comprising a first electrically conductive layer, a second electrically insulative layer adjacent the first layer, and a third electrically conductive layer adjacent the second layer and in electrical communication with the dielectric layer, the second insulative layer being sandwiched between the first and third conductive layers; and an electrically conductive interconnect extending over the second insulative layer and electrically interconnecting the first and second conductive layers of the first capacitor plate.

More particularly and first with reference to FIG. 1, a semiconductor wafer fragment in process is indicated generally with reference numeral 10. Such comprises a bulk semiconductor silicon substrate 12 having an electrically conductive diffusion region 14 provided therein. Region 14 constitutes a node to which electrical connection to a capacitor is to be made. An insulating layer 16, typically borophosphosilicate glass (BPSG), overlies substrate 12 and includes a previously provided contact opening 18 over node 14. Contact opening 18 is filled with an electrically conductive first material 20 which electrically connects with node 14. Aspects of the invention are believed to have their greatest significance when component 20 comprises a material which is reactive to form an electrically insulative material (i.e., insulative oxides or insulative nitrides). An example and preferred material is conductively doped polysilicon which readily oxidizes to insulating $SiO_2$. An etch stop layer 21 is provided atop insulating layer 16, with the composite structure being provided with an upper planarized surface as shown.

Referring to FIG. 2, an electrically insulative barrier second layer 22 is provided over first conductive layer 20. An example and preferred thickness for layer 22 is 1000 Angstroms. Example and preferred materials for layer 22 include $Al_2O_3$, $TiO_2$, $Si_3N_4$, $SiO_2$ and AlN, or mixtures thereof. Such layer will provide at least one or two barrier functions. Where material of electrically conductive component 20 comprises something which will react to form an electrically insulative material, barrier second layer 22 will be designed to serve the function of restricting such reaction at a later step in the process, as will be apparent subsequently. Alternately or in addition thereto, layer 22 serves the function of preventing out-diffusion of layer 20 components.

A third layer 24 is provided over electrically insulative barrier layer 22. An example and preferred thickness is 1000 Angstroms. Third layer 24 comprises a material which is either electrically conductive and resistant to oxidation (i.e., elemental platinum), or a material which forms an electrically conductive material upon oxidation (i.e., elemental Ru which upon oxidation is transformed to a conductive $RuO_2$). Layers 20, 22, and 24 comprise components of a capacitor plate.

Referring to FIG. 3, an insulating inorganic metal oxide dielectric layer 26 is provided over electrically conductive third layer 24. Example insulating inorganic metal oxide materials usable in accordance with the invention include ferroelectrics or other perovskite materials, or other materials, such as titanates, zirconates, niobates, tantalates and nitrates, such as those shown below.

| Barium Titanate | $BaTiO_3$ |
| Barium Strontium Titanate | $(Ba,Sr)TiO_3$ |
| Barium Lead Titanate | $(Ba,Pb)TiO_3$ |
| Lead Titanate | $PbTiO_3$ |
| Lead Zirconate | $PbZnO_3$ |
| Lead Zirconate Titanate | $Pb(Zn,Ti)O_3$ |
| Lead Lanthinum Titanate | $(Pb,La)TiO_3$ |
| Lead Lanthinum Zirconate Titanate | $(Pb,La)(Zn,Ti)O_3$ |
| Strontium Titanate | $SrTiO_3$ |
| Potassium Nitrate | $KNO_3$ |
| Lithium Niobate | $LiNbO_3$ |
| Lithium Tantalate | $LiTaO_3$ |
| Lead Magnesium Niobate (Mixed phases) | $Pb(Mg,Nb)O_3$ $Pb(Mg,Nb)O_3:PbTiO_3$ |
| Bismuth Titanate | $Bi_4Ti_3O_{12}$ |

Deposition of such materials typically involves chemical vapor deposition involving oxygen which would lead to oxidation of electrically conductive first layer 20 were oxidation barrier layer 22 not present. Further even after deposition of such materials, densification of such layers typically occurs to complete the provision of the desired material. Such typically occurs in an oxygen rich atmosphere at elevated temperatures, which also would oxidize the preferred polysilicon material of layer 20 were layer 22 not present. Accordingly in such instance, barrier second layer 22 restricts oxidation of first electrically conductive layer 20 during provision of insulating inorganic metal oxide dielectric layer 26. Barrier layer 22 also prevents interaction of layer 24 with layer 20.

An electrically conductive fourth layer 28 is provided over insulating inorganic metal oxide dielectric layer 26, with 1000 Angstroms being an example preferred thickness. A preferred material for layer 28 is Pt, Ru or $RuO_x$.

Figure 4:
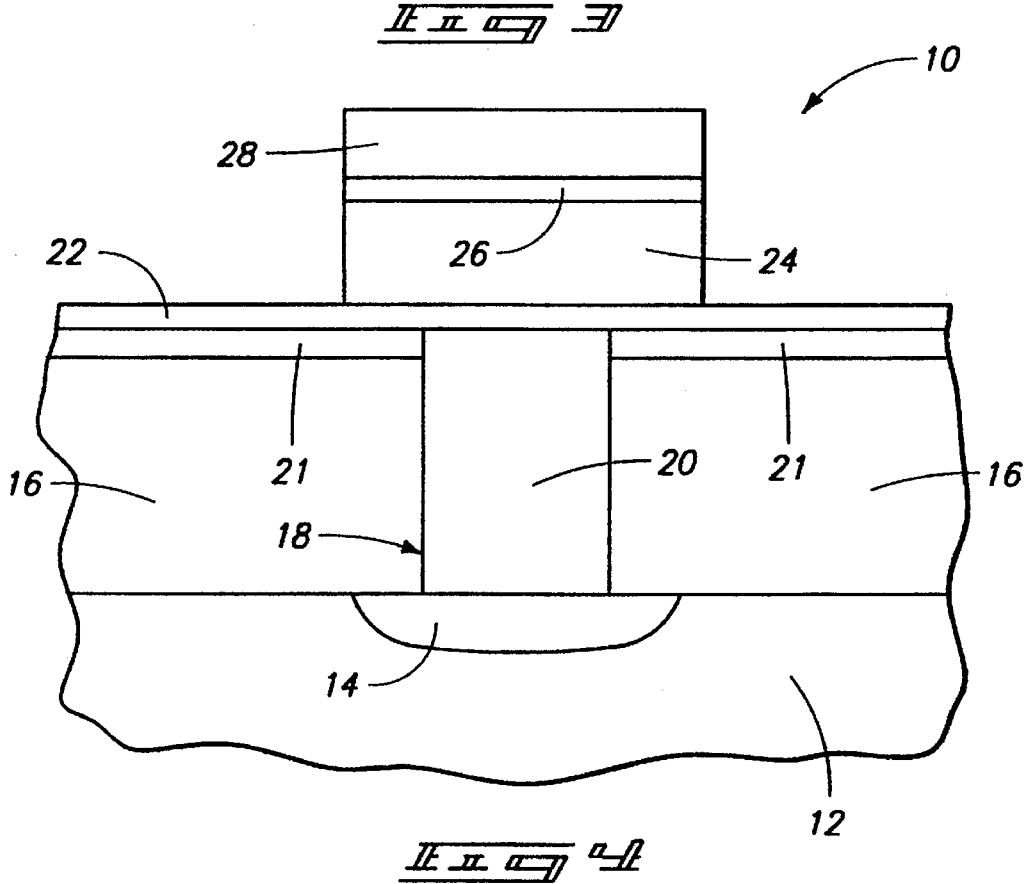
FIG. 4 is a view of the FIG. 1 wafer at a processing step subsequent to that shown by FIG. 3.

Referring to FIG. 4, layers 28, 26 and 24 are patterned and etched selectively relative to barrier layer 22 to effectively define the outline of a desired capacitor shape. Layer 28 effectively comprises a second capacitor plate, while layers 24, 22 and 20 comprise first capacitor plate components. At this point in the process, however, polysilicon layer 20 is electrically isolated from layer 24 by insulating barrier layer 22.

Referring to FIG. 5, a layer of $SiO_2$ is deposited and anisotropically etched to produce oxide spacers 30. Such spacers protect dielectric layer 26 from a conductive layer deposition described below.

Referring to FIG. 6, an isotropic undercut etching of oxidation barrier layer 22 is conducted selectively relative to polysilicon, nitride and the material of layer 24 to expose first and third layers 20 and 24, respectively. An example etch chemistry would be hot sulfuric acid to etch a $TiO_2$ layer, or ammonium hydroxide to etch an $Al_2O_3$ layer. For purposes which will be apparent from the continuing discussion, first layer 20 comprises outermost peripheral sidewalls 32; oxidation barrier second layer 22 comprises outermost peripheral sidewalls 34; and third layer 24 comprises outermost peripheral sidewalls 36. As shown, second layer sidewalls 34 are received entirely within the peripheral confines of both the first and third layer sidewalls 32 and 36, respectively.

Figure 7:
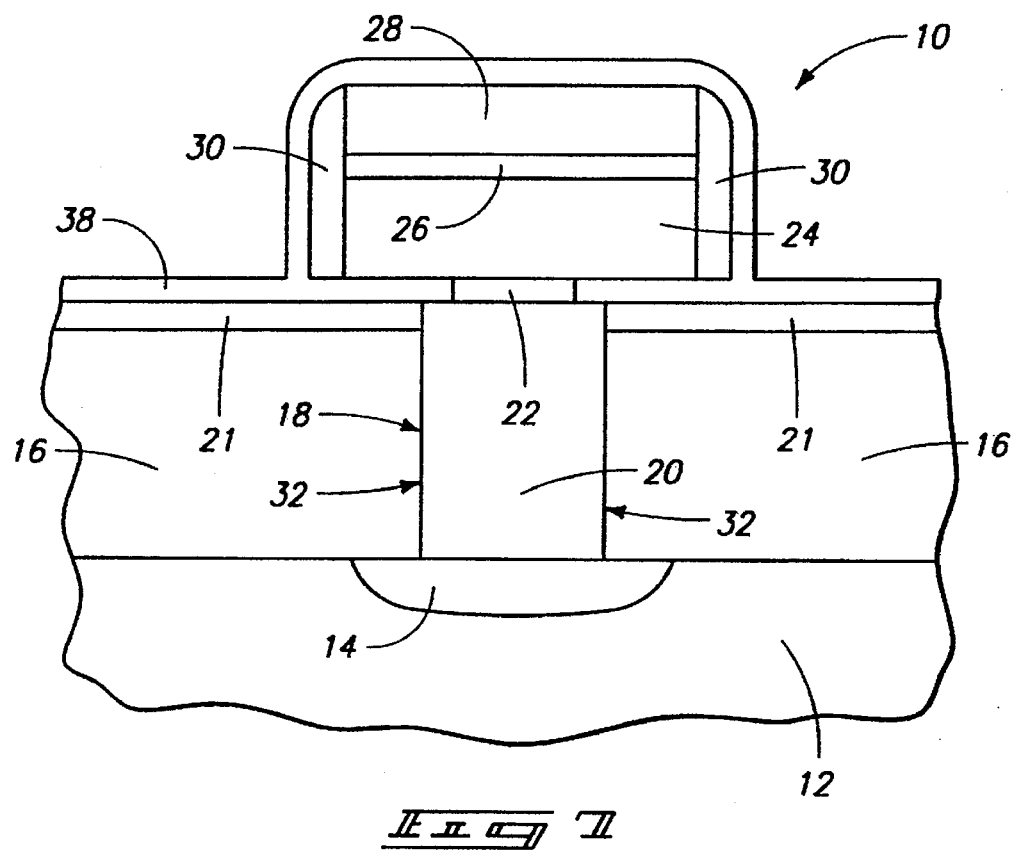
FIG. 7 is a view of the FIG. 1 wafer at a processing step subsequent to that shown by FIG. 6.
Figure 8:
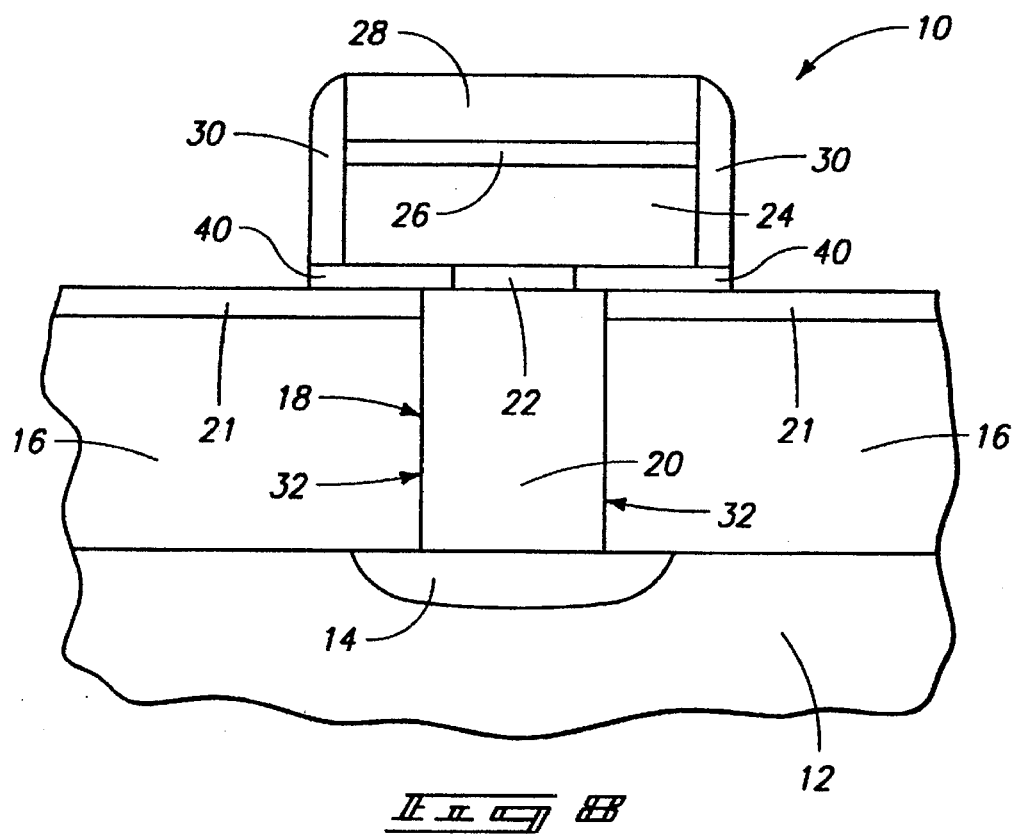
FIG. 8 is a view of the FIG. 1 wafer at a processing step subsequent to that shown by FIG. 7.

Referring to FIG. 7, a highly conformal electrically conductive layer 38 is chemical vapor deposited over the wafer to fill the void beneath layer 24 and spacers 30. Thus, electrically conductive layer 38 is conformally deposited over exposed first layer 20 and exposed third layer 24. Example and preferred materials are TiN and W. By way of example only, W can be chemical vapor deposited using $WF_6$ and $H_2$ as precursors at 450° C. and 80 Torr. TiN can be deposited using either $TiCl_4$ and $NH_3$, or tetrakisdimethylamido titanium, as precursors. Layer 38 is then etched (wet etch using a 1:1 mix of $NH_4OH$ and $H_2O_2$ for either TiN or W) to produce a surrounding electrically conductive interconnect 40 (FIG. 8) which extends around second insulative oxidation barrier layer 22 and electrically interconnects first conductive layer 20 and third conductive layer 24. Accordingly, electrically interconnecting link 40 is at least partially received within the peripheral confines of first sidewalls 32 and third sidewalls 36 (FIG. 6). In the described and preferred sequence, the final patterning to produce interconnect 40 occurs last in the above stated steps.

One example alternate and integrated sequence of processing steps are shown and described with reference to FIGS. 9–19 in fabrication of a bit line over stacked capacitor DRAM construction. Like numerals are utilized from the previous embodiment where appropriate, with differences being indicated with the suffix "a" or different numerals.

Figure 9:
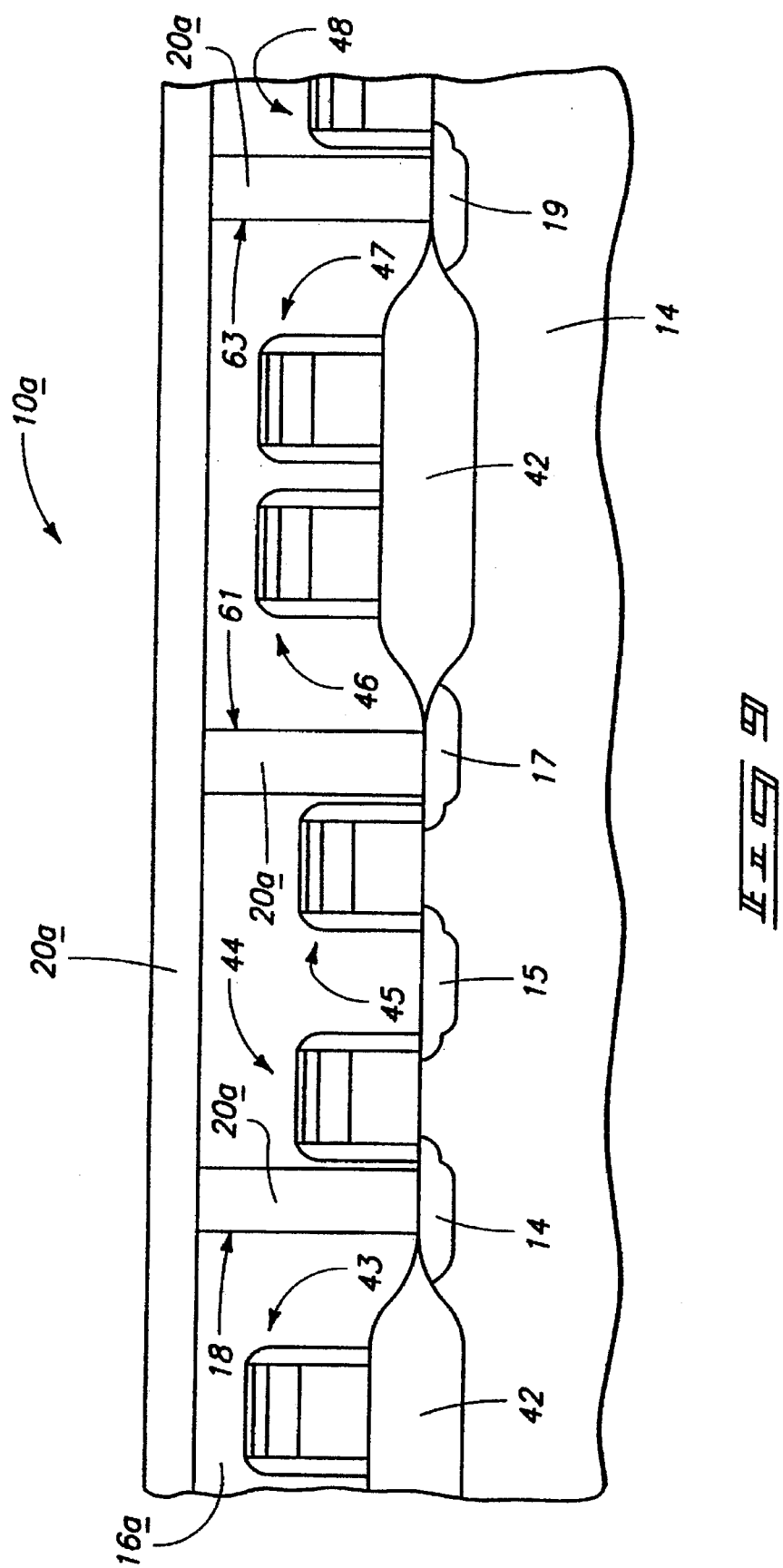
FIG. 9 is a diagrammatic cross sectional view of an alternate embodiment semiconductor wafer fragment at a processing step in accordance with the invention.

Referring first to FIG. 9, wafer fragment 10a comprises bulk substrate 12 having diffusion regions 14, 15, 17, 19, and field oxide regions 42 provided therein. A series of word lines 43, 44, 45, 46, 47 and 48 are provided. An insulating layer 16a is also provided, and has contacts 18, 61 and 63 provided therethrough. Such are filled by a first conductive polysilicon layer 20a.

Figure 10:
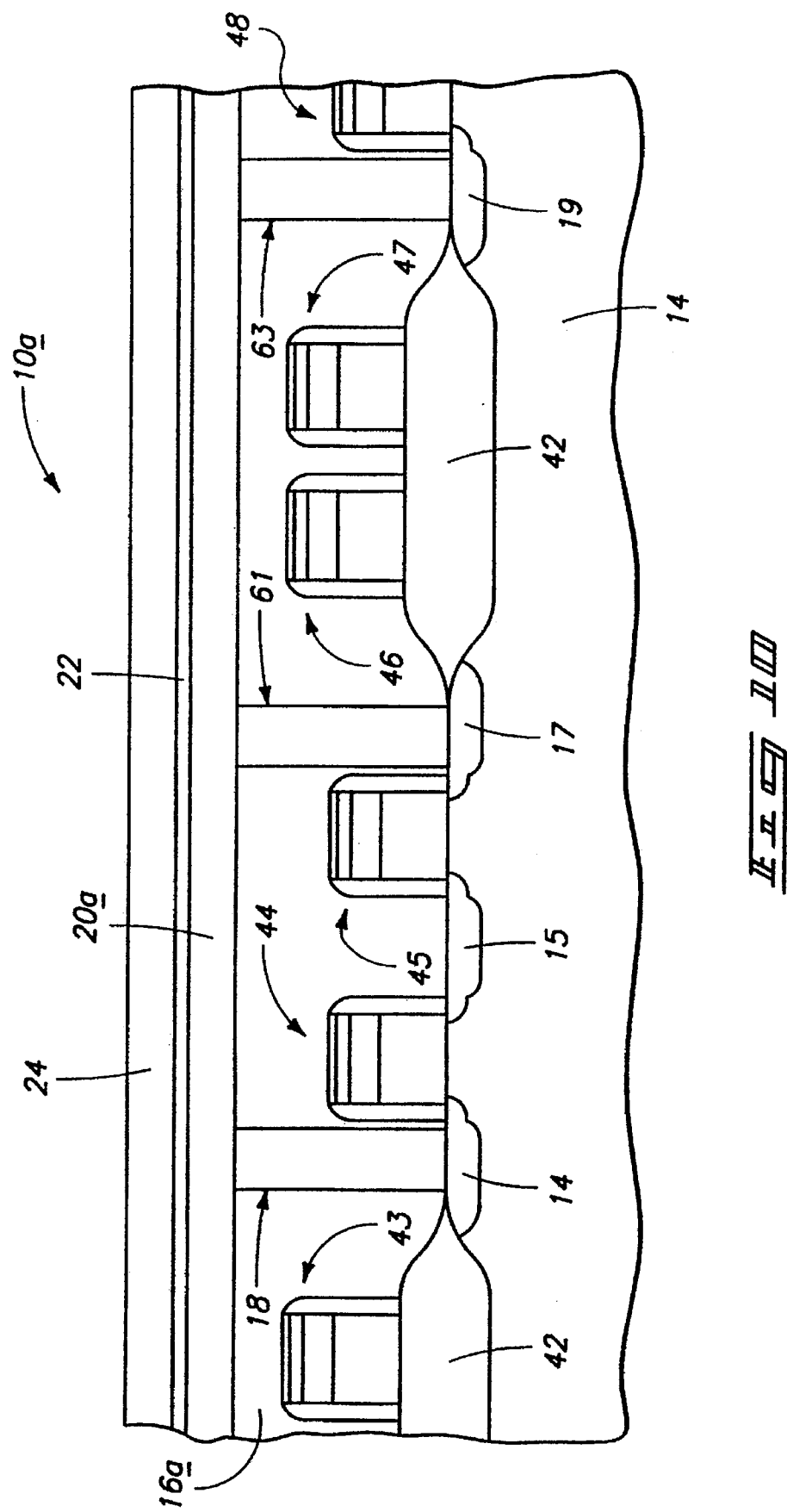
FIG. 10 is a view of the FIG. 9 wafer at a processing step subsequent to that shown by FIG. 9.

Referring to FIG. 10, oxidation barrier layer 22 and third conductive layer 24 are provided.

Figure 11:
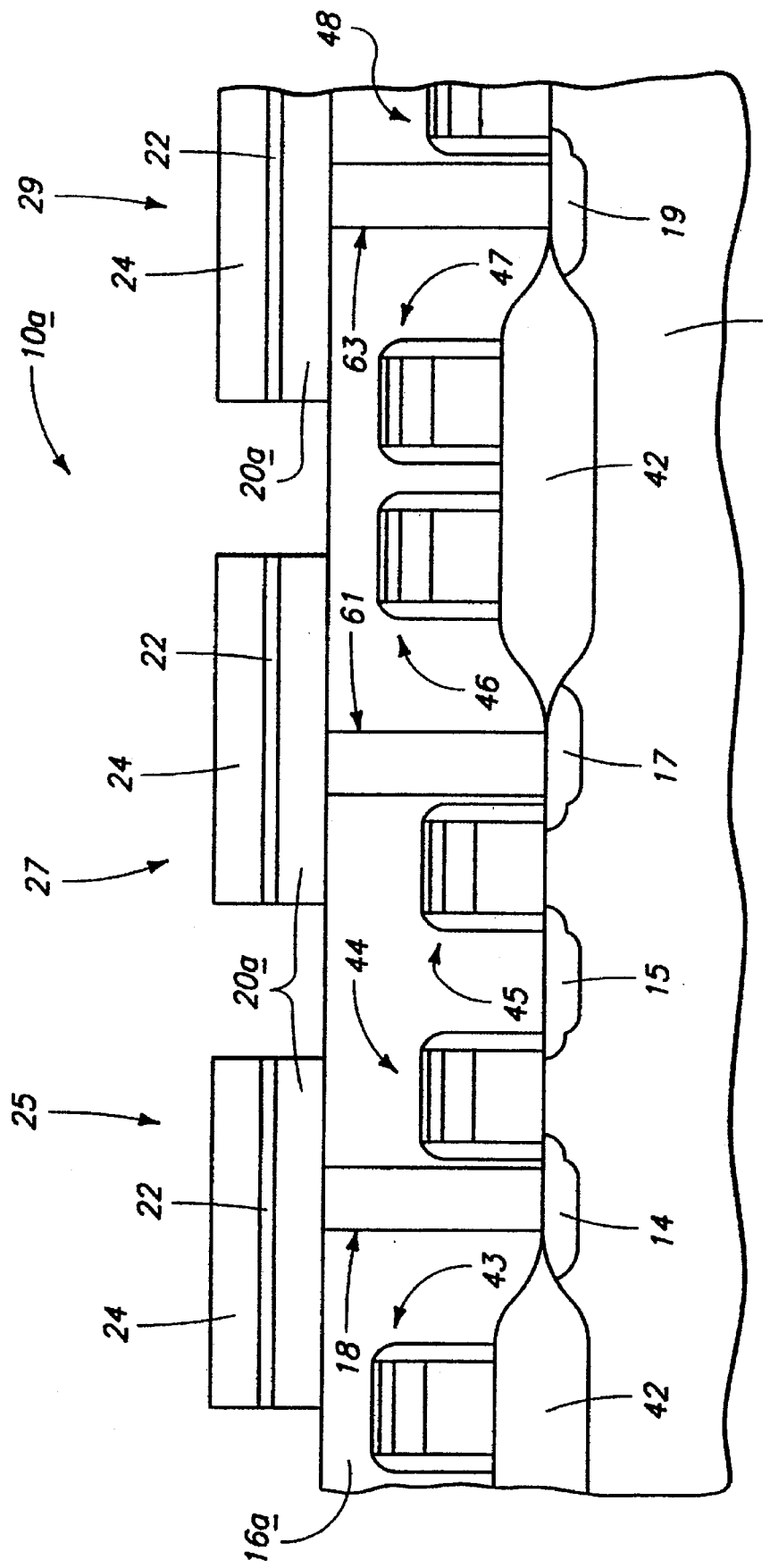
FIG. 11 is a view of the FIG. 9 wafer at a processing step subsequent to that shown by FIG. 10.

Referring to FIG. 11, layers 24, 22, and 20a are patterned as shown to provide the indicated outlines of first capacitor plates 25, 27 and 29.

Figure 12:
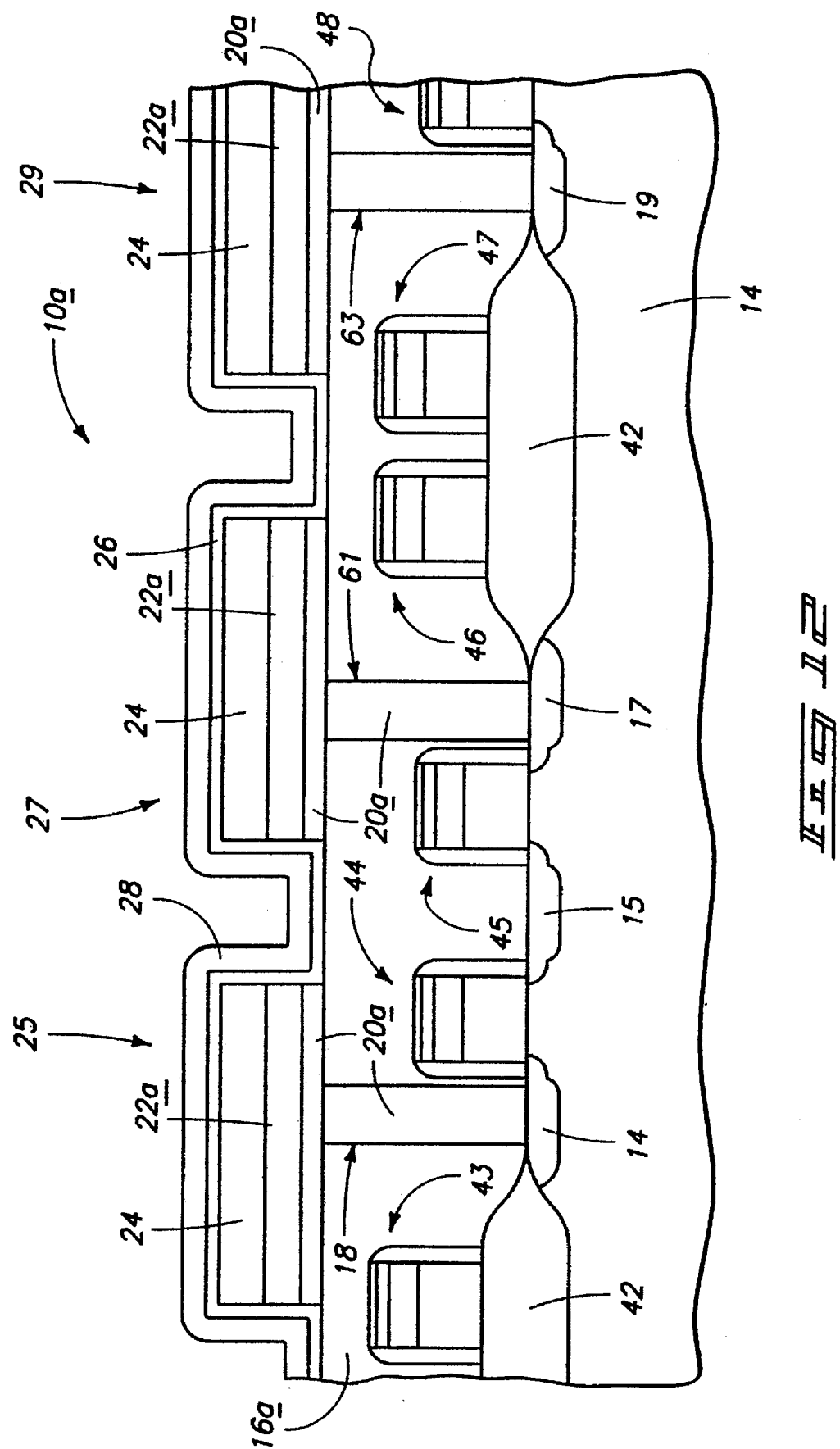
FIG. 12 is a view of the FIG. 9 wafer at a processing step subsequent to that shown by FIG. 11.

Referring to FIG. 12, insulating inorganic metal oxide dielectric layer 26 and third conductive layer 28 are provided. Where for example layer 22 comprises $SiO_2$, which provides an inherent diffusion barrier function but not an inherent antioxidation function, layer 22 might grow to the FIG. 12 illustrated size 22a. In such instance, the thickness of original layer 22, more so than its composition, provides the predominant barrier function to undesired reaction of layer 20a.

Figure 13:
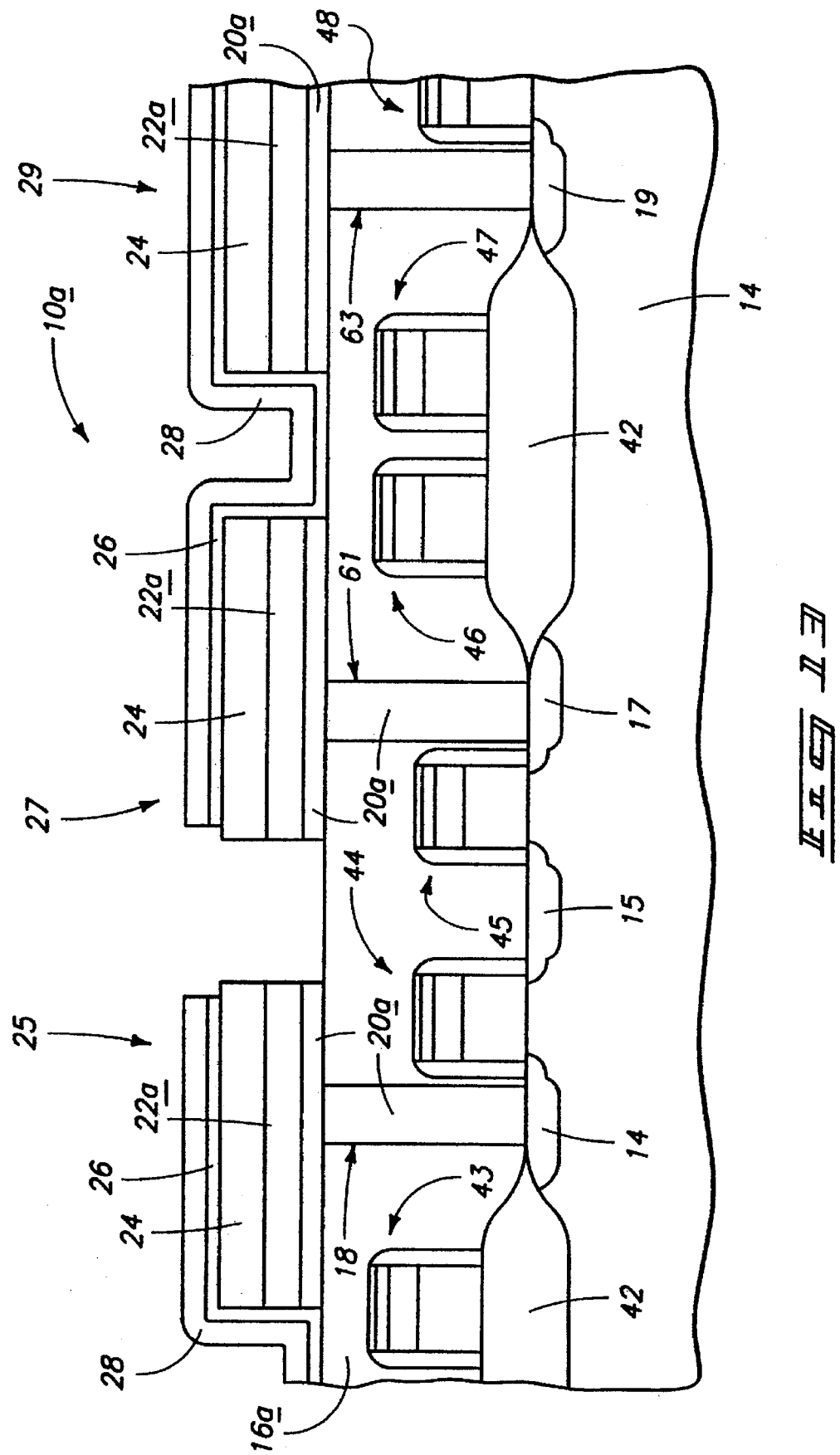
FIG. 13 is a view of the FIG. 9 wafer at a processing step subsequent to that shown by FIG. 12.

Referring to FIG. 13, layers 26 and 28 are patterned and etched over what will be a bit contact node 15.

Figure 14:
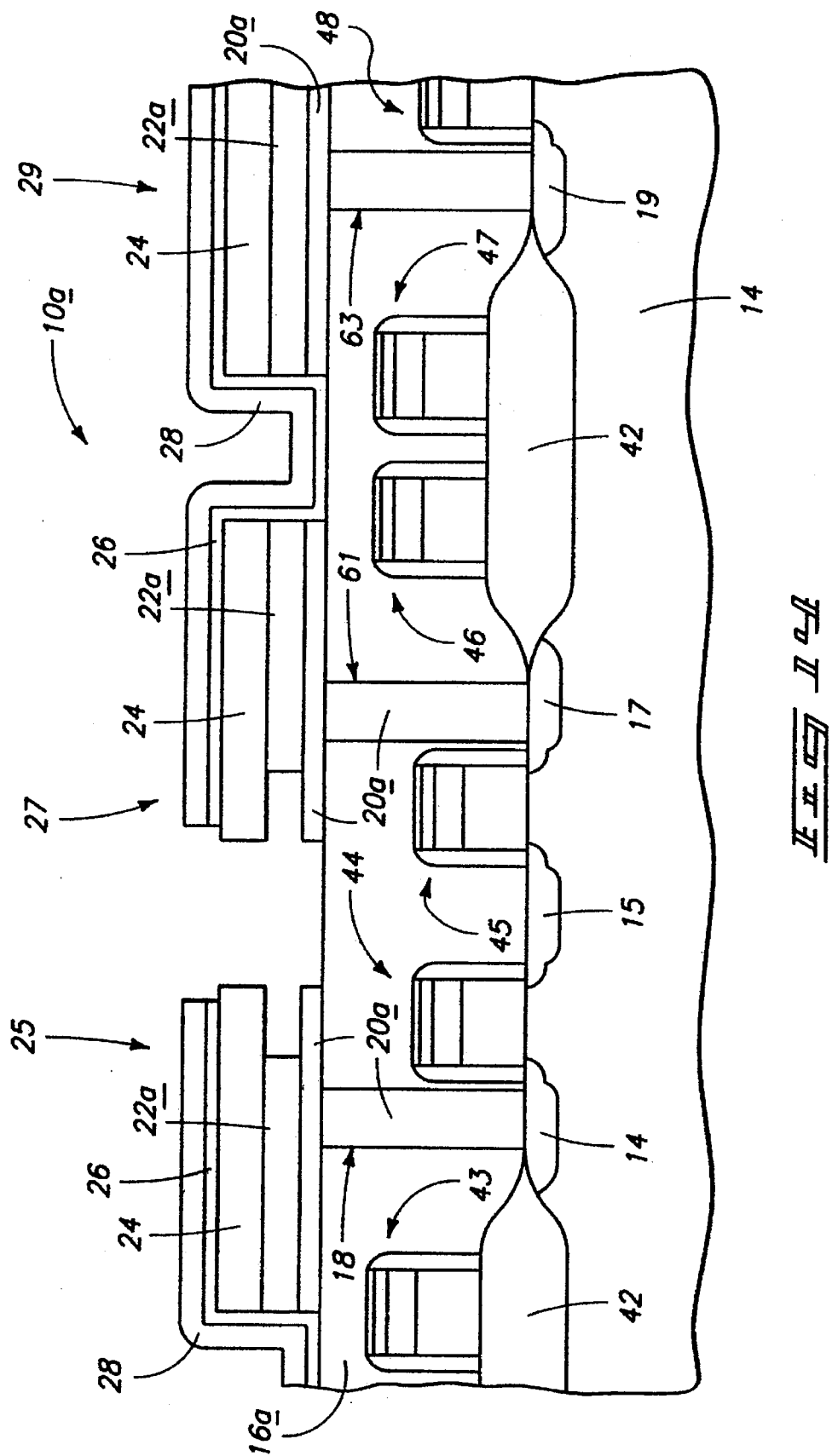
FIG. 14 is a view of the FIG. 9 wafer at a processing step subsequent to that shown by FIG. 13.

Referring to FIG. 14, oxidation barrier layer 22 is undercut etched selectively relative to first conductive layer 20 and conductive third layer 24 to outwardly expose such layers.

Figure 15:
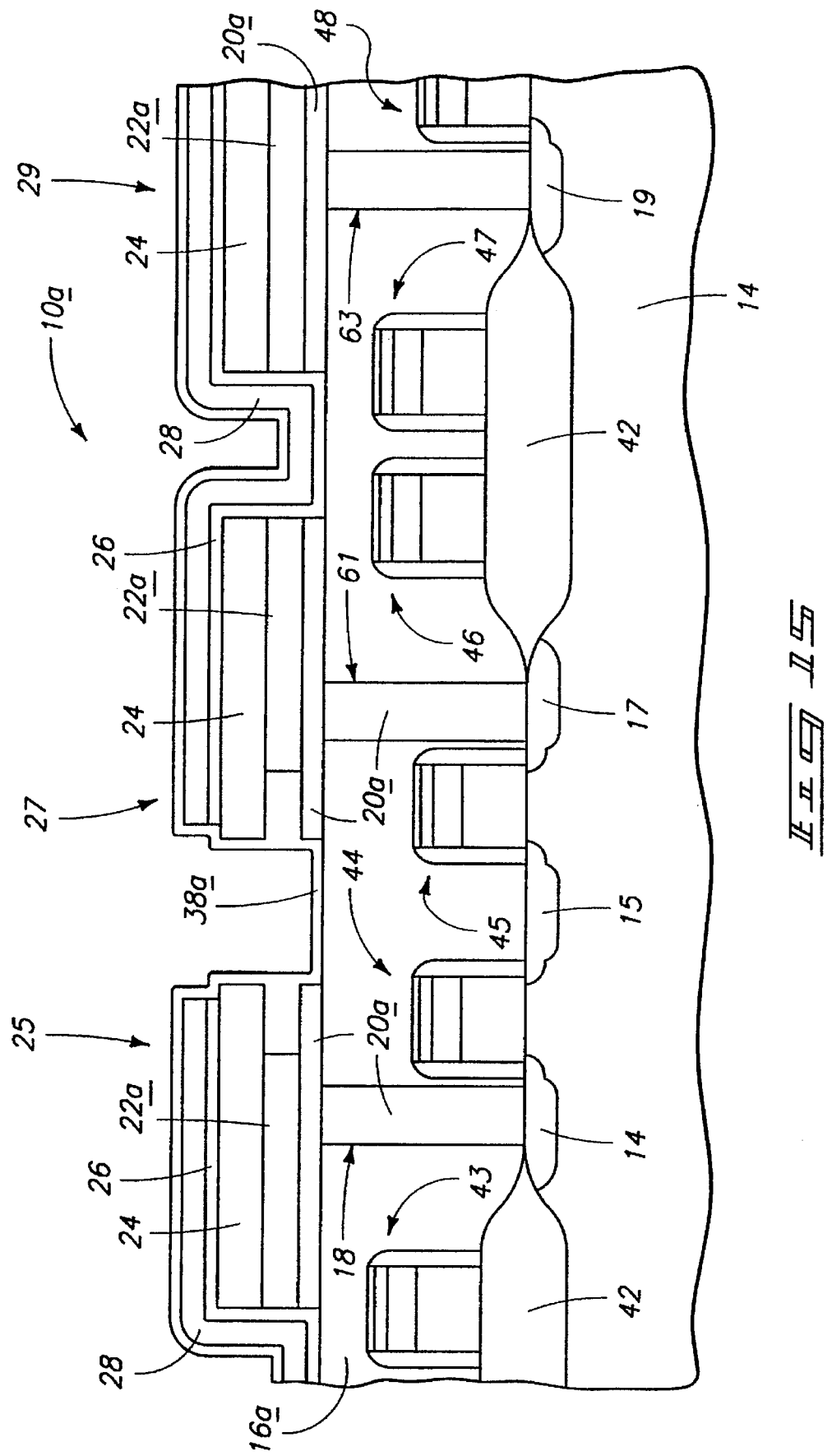
FIG. 15 is a view of the FIG. 9 wafer at a processing step subsequent to that shown by FIG. 14.

Referring to FIG. 15, a conformal layer 38a of TiN or another conductive material is chemical vapor deposited atop the substrate to completely fill the voids created by the undercut etching.

Figure 16:
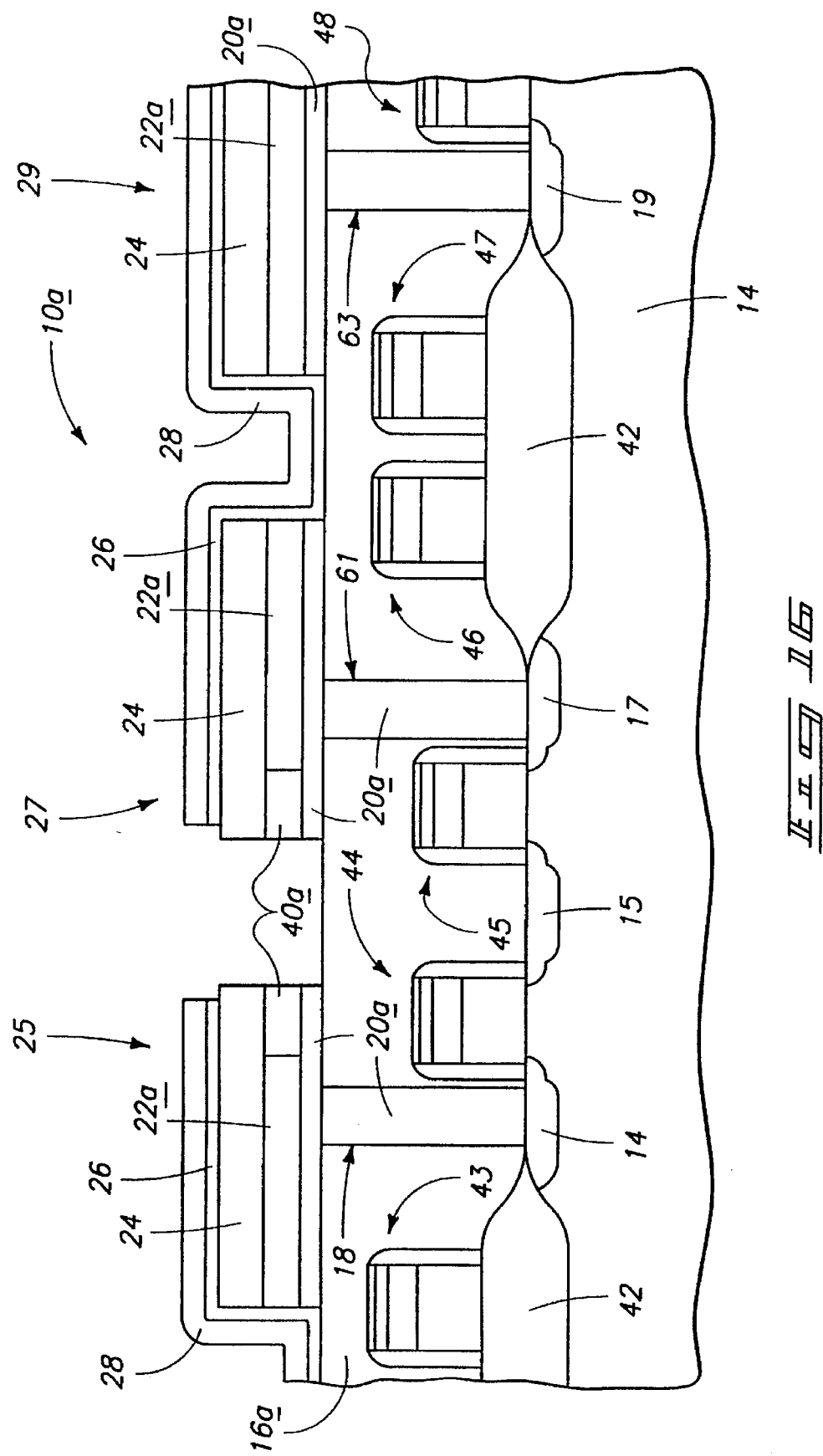
FIG. 16 is a view of the FIG. 9 wafer at a processing step subsequent to that shown by FIG. 15.

Referring to FIG. 16, layer 38a is wet or dry etched to produce the illustrated electrically conductive interconnects 40a which extend around second insulative layer 22a and electrically interconnect the first layer 20 and the third layer 24 of the respective capacitors. Note that in accordance with this described embodiment, electrical interconnecting link 40a is received entirely within the peripheral confines of the outer sidewalls of layers 20a and 24.

Figure 17:
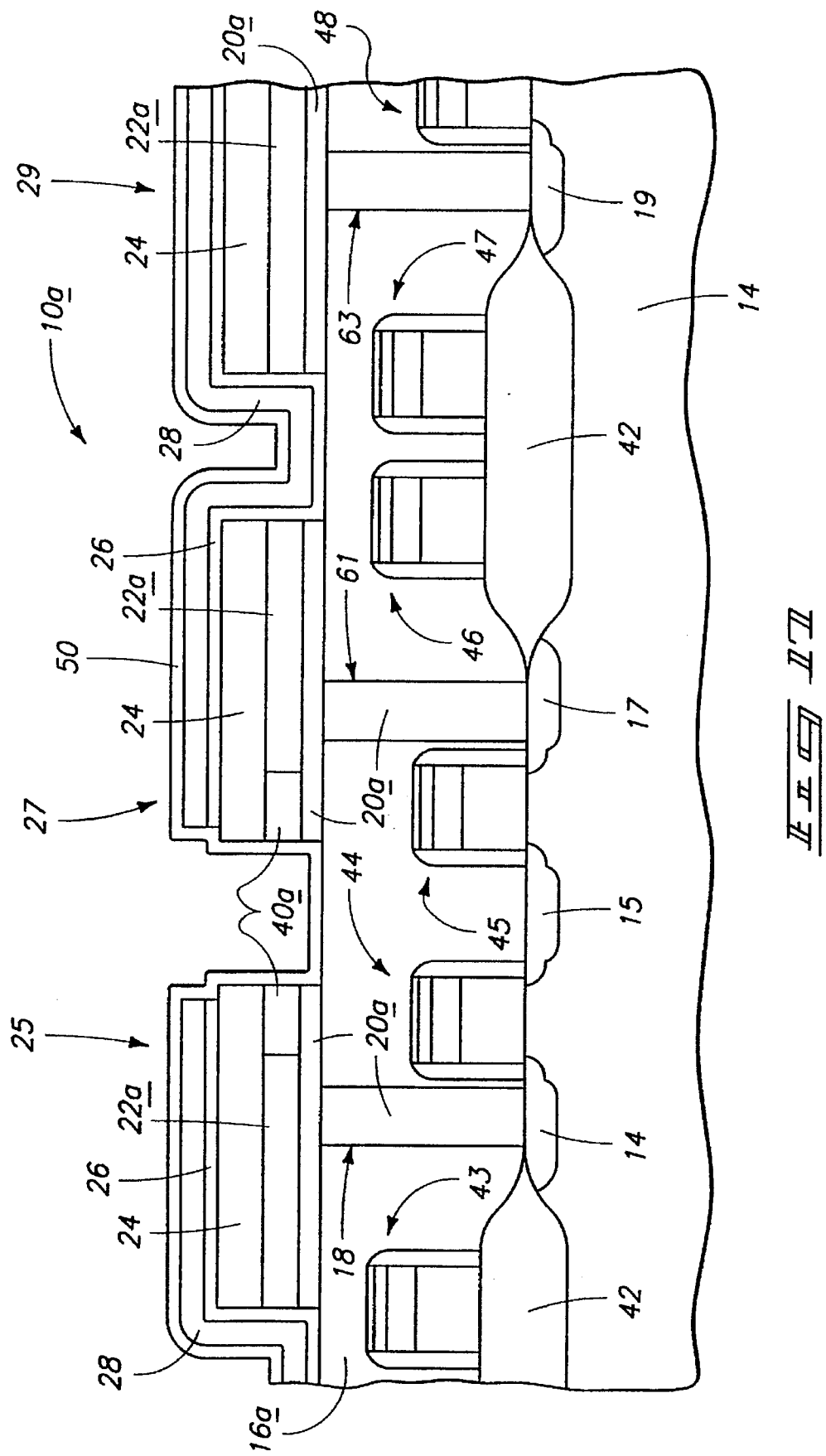
FIG. 17 is a view of the FIG. 9 wafer at a processing step subsequent to that shown by FIG. 16.

Referring to FIG. 17, an insulative layer 50 is deposited to protect the edge of dielectric layer 26.

Figure 18:
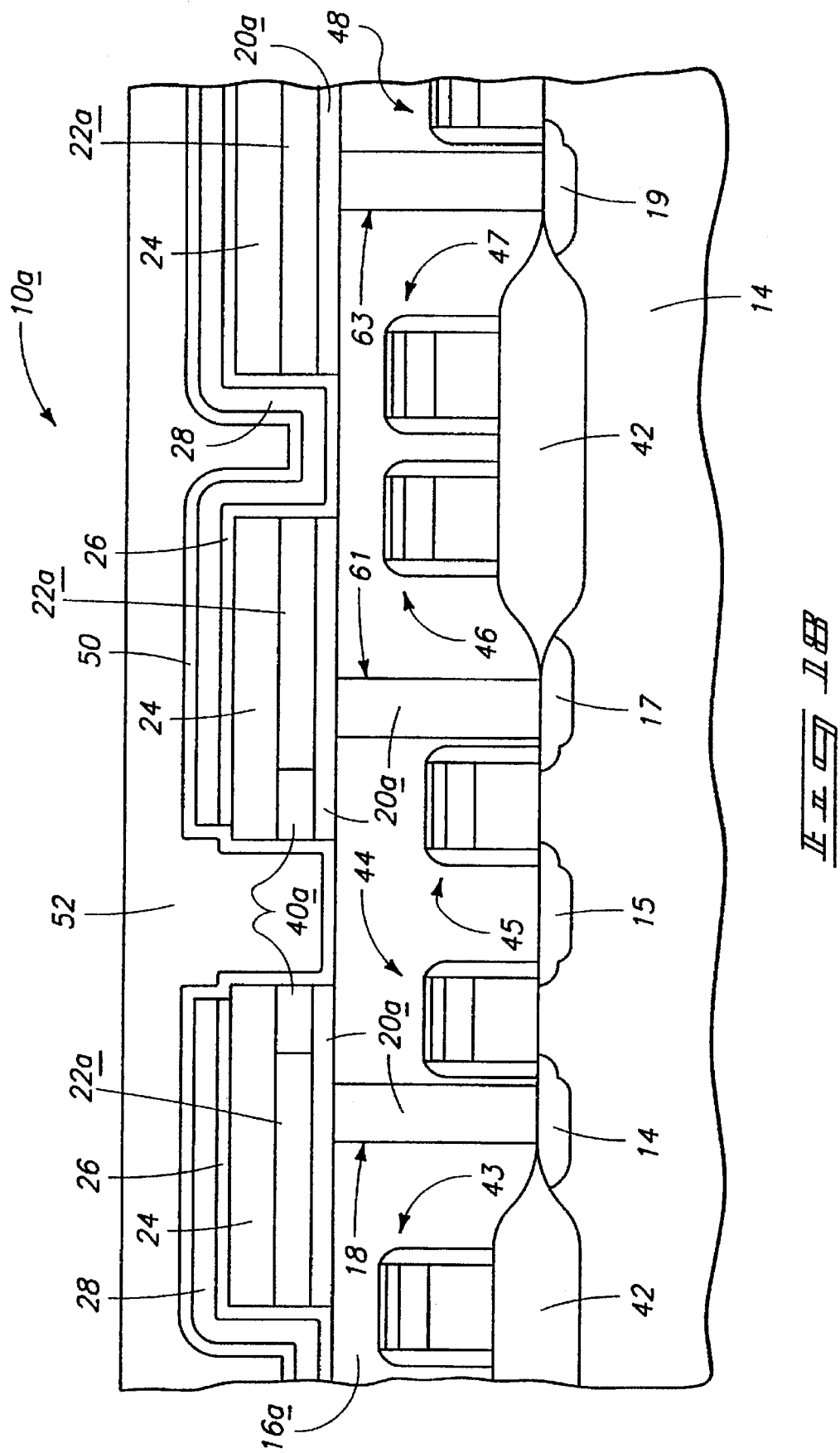
FIG. 18 is a view of the FIG. 9 wafer at a processing step subsequent to that shown by FIG. 17.

Referring to FIG. 18, a layer 52 of borophosphosilicate glass is deposited and planarized.

Figure 19:
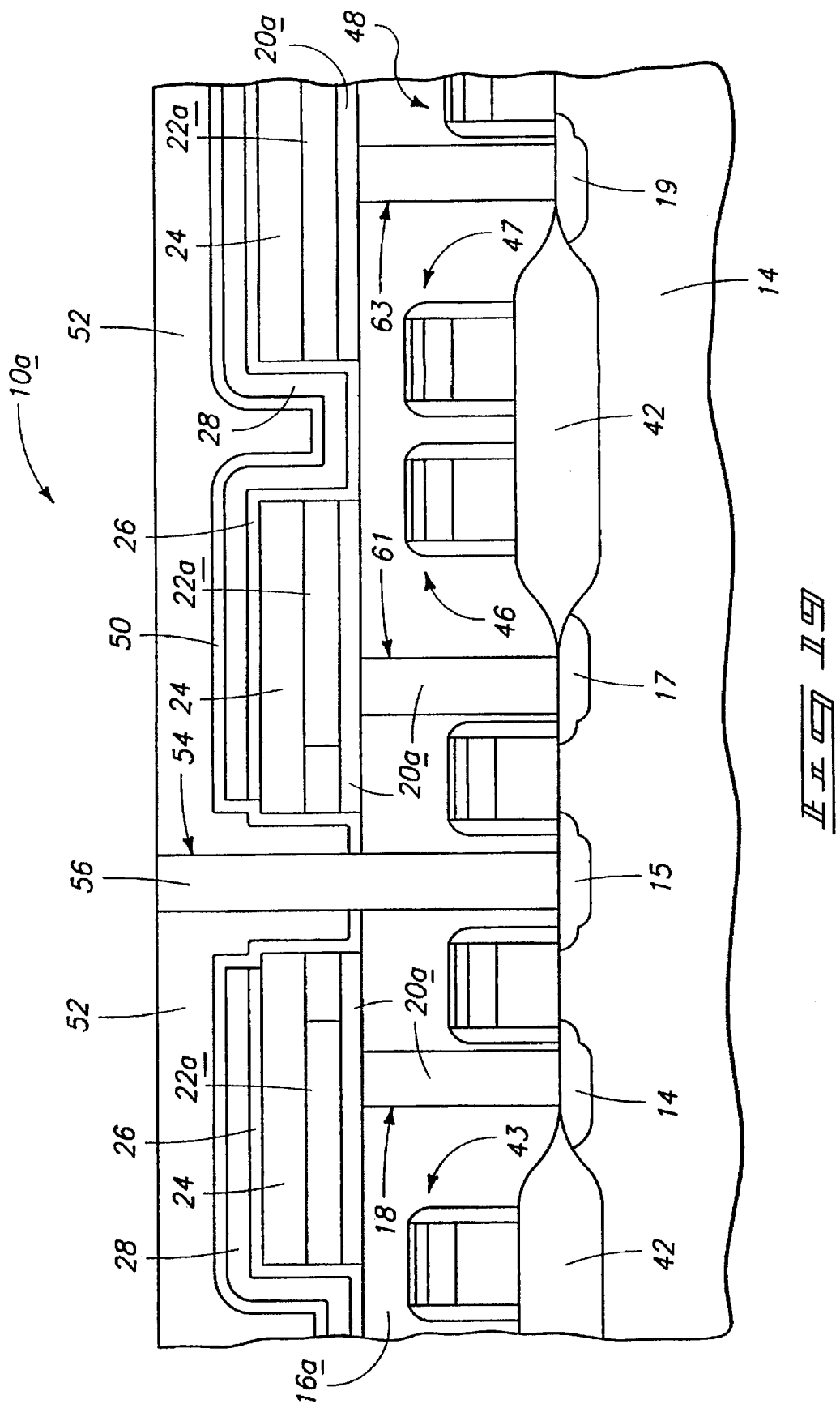
FIG. 19 is a view of the FIG. 9 wafer at a processing step subsequent to that shown by FIG. 18.

Referring to FIG. 19, a contact opening 54 is provided therein and etched to outwardly expose bit node 15. Subsequently, contact 54 is filled with a conductive plug filling material 56, such as tungsten. Thereafter, a conductive layer would be provided atop plug 56 and BPSG layer 52 and patterned into desired bit lines.

The above described method provides the advantage of utilizing good barrier layers which are electrically insulative, as opposed to the prior art's essential use of conductive barrier layers which limits choices.

Figure 20:
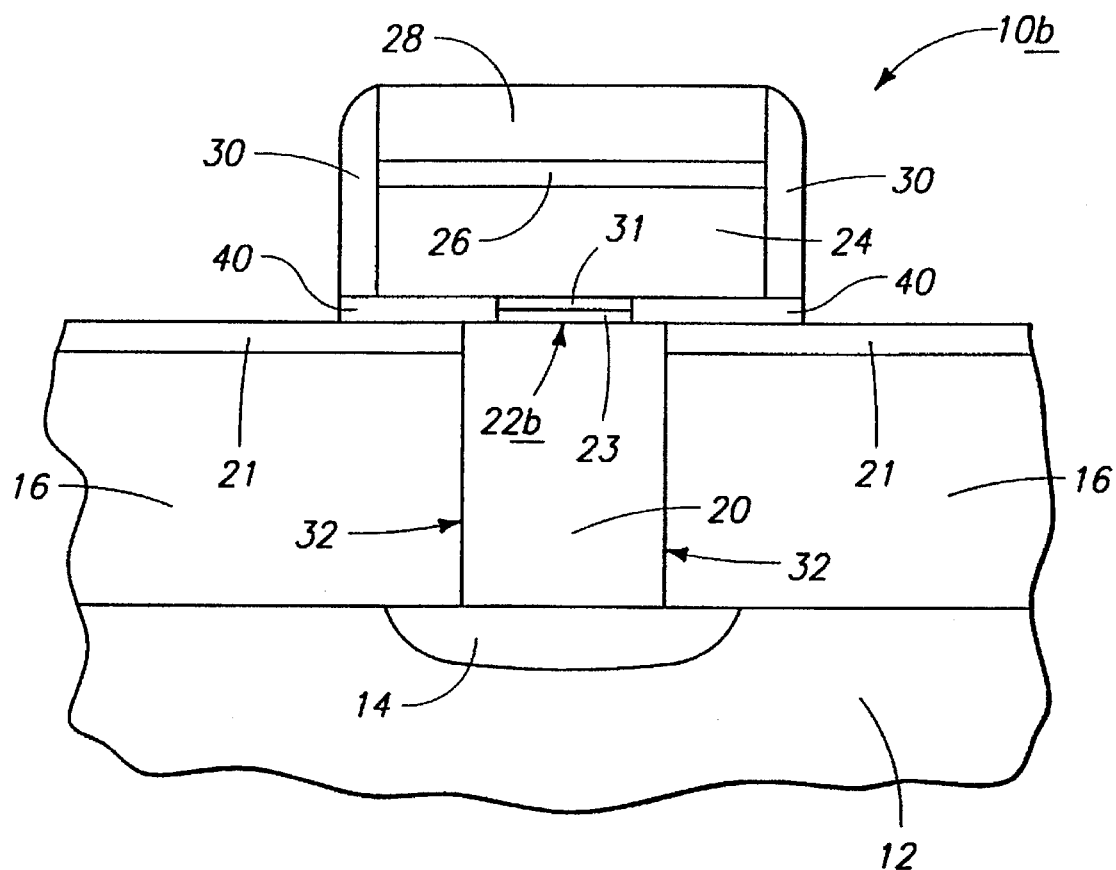
FIG. 20 is a diagrammatic cross section of another alternate embodiment capacitor construction in accordance with the invention.

Another alternate embodiment is shown in FIG. 20. Like numerals are utilized from the first described embodiment where appropriate, with differences being indicated with the suffix "b" or different numerals. The FIG. 20 embodiment 10b is analogous to that shown in FIG. 8. The difference is that barrier second layer 22b comprises discrete electrically insulative layers 23 and 31 of different materials. This design might be desired where both reaction and diffusion barrier properties are desired for layer 22, and using separate layers for the separate functions.

Figure 21:
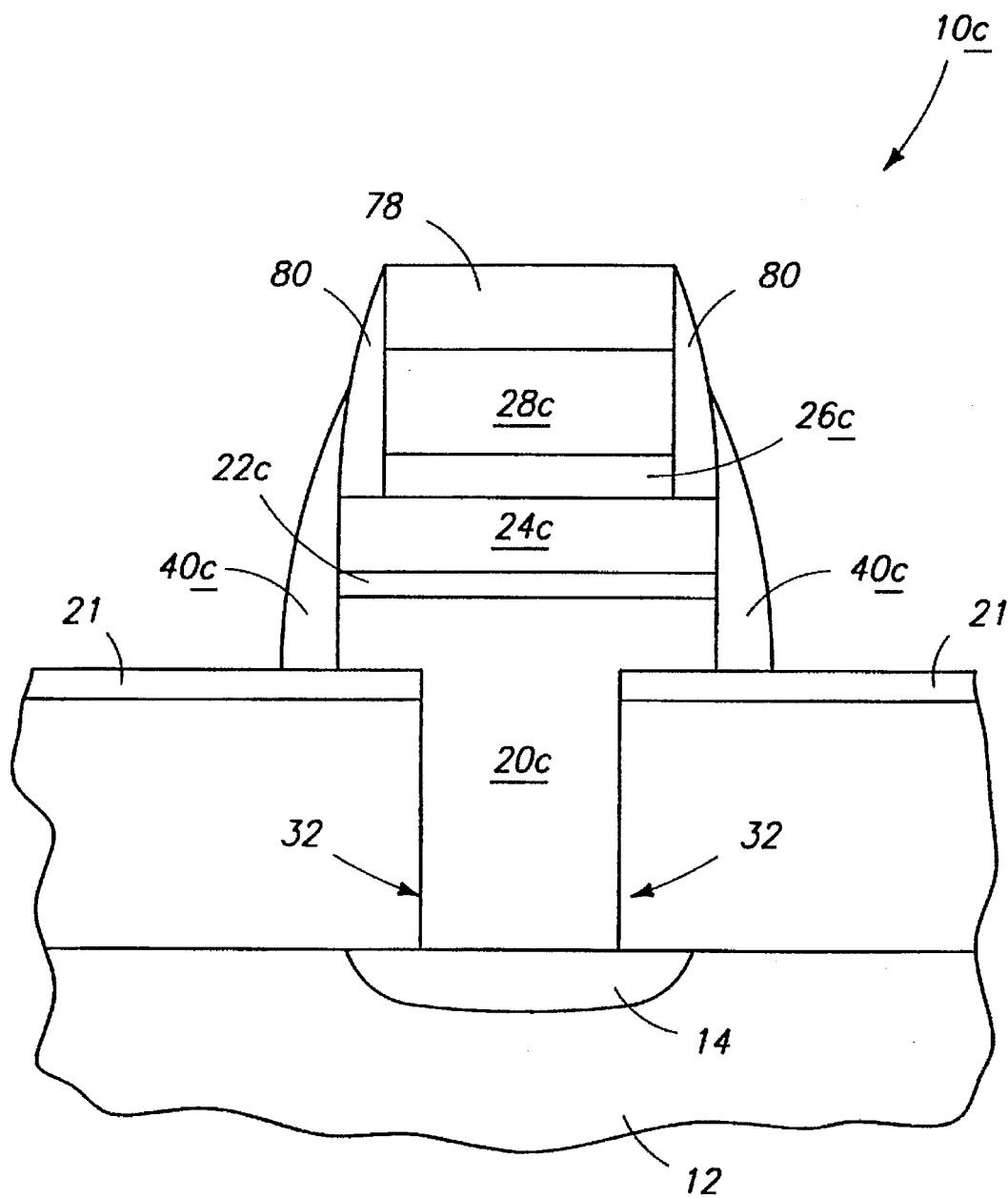
FIG. 21 is a diagrammatic cross section of yet another alternate embodiment capacitor construction in accordance with the invention.

Yet another alternate embodiment is shown in FIG. 21. Like numerals are utilized from the first described embodiment where appropriate, with differences being indicated with the suffix "c" or different numerals. Construction 10c places a portion of first layer 20c above layer 21 such that outer sidewalls thereof can be exposed outwardly of layer 21. Accordingly, undercut etching of layer 22 is not conducted for the purpose of exposing layers 20c and 24c for electrical interconnect. An insulating cap 78 and spacers 80 are provided as shown relative to the upper capacitor plate 28c and dielectric layer 26c. Thereafter, an electrically conductive layer, such as TiN, is deposited and anisotropically etched to produce conductive interconnecting links 40c with join layers 24c and 20c.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor comprising the following steps:

providing a node to which electrical connection to a capacitor is to be made;

providing an electrically conductive first layer over the node; providing an electrically insulative barrier second layer over the first conductive layer;

providing a third layer over the electrically insulative barrier layer, the third layer comprising a material which is electrically conductive;

providing an insulating inorganic metal oxide dielectric layer over the electrically conductive third layer;

providing an electrically conductive fourth layer over the insulating inorganic metal oxide dielectric layer; and providing an electrically conductive interconnect to extend over the second insulative layer and electrically interconnect the first and third conductive layers.

2. The method of forming a capacitor of claim 1 wherein the first layer comprises a material which is reactable to form an electrically insulating material, and the barrier second layer restricts reaction of the first electrically conductive layer to an insulating material during the step of providing the insulating inorganic metal oxide dielectric layer.

3. The method of forming a capacitor of claim 1 wherein the barrier second layer forms a diffusion barrier to out-diffusion of components of the first electrically conductive layer to the third layer.

4. The method of forming a capacitor of claim 1 wherein, the first layer comprises a material which is reactable to form an electrically insulating material; and the barrier second layer comprises a composite of discrete fifth and sixth electrically insulative layers, one of the fifth and sixth layers restricting reaction of the first electrically conductive layer to an insulating material during the step of providing the insulating inorganic metal oxide dielectric layer, the other of the fifth and sixth layers forming a diffusion barrier to out-diffusion of components of the first electrically conductive layer to the third layer.

5. The method of forming a capacitor of claim 1 wherein the first layer comprises conductively doped polysilicon.

6. The capacitor of claim 1 wherein the electrically insulative oxidation barrier layer is selected from the group consisting of $Al_2O_3$, $TiO_2$, $Si_3N_4$, $SiO_2$ and AlN, and mixtures thereof.

7. The method of forming a capacitor of claim 1 wherein the insulating inorganic metal oxide dielectric layer comprises a ferroelectric material.

8. The method of forming a capacitor of claim 1 wherein the insulating inorganic metal oxide dielectric layer comprises a material selected from the group consisting of titanates, zirconates, niobates, tantalates and nitrates, and mixtures thereof.

9. The method of forming a capacitor of claim 1 wherein the electrically insulative oxidation barrier second layer is selected from the group consisting of $Al_2O_3$, $TiO_2$, $Si_3N_4$, $SiO_2$ and AlN, and mixtures thereof, and the insulating inorganic metal oxide dielectric layer comprises a ferroelectric material.

10. The method of forming a capacitor of claim 1 wherein the third layer comprises elemental platinum.

11. The method of forming a capacitor of claim 1 wherein the third layer comprises elemental Ru which upon oxidation is transformed to $RuO_2$.

12. The method of forming a capacitor of claim 1 wherein the third layer as initially provided comprises $RuO_2$.

13. The method of forming a capacitor of claim 1 wherein the first layer comprises conductively doped polysilicon, and the third layer comprises elemental platinum.

14. The method of forming a capacitor of claim 1 wherein the first layer comprises conductively doped polysilicon, and the third layer ultimately comprises $RuO_2$.

15. The method of forming a capacitor of claim 1 wherein the electrically insulative oxidation barrier second layer is selected from the group consisting of $Al_2O_3$, $TiO_2$, $Si_3N_4$, $SiO_2$ and AlN, and mixtures thereof; the first layer comprises conductively doped polysilicon, and the third layer comprises elemental platinum.

16. The method of forming a capacitor of claim 1 wherein the electrically insulative oxidation barrier second layer is selected from the group consisting of $Al_2O_3$, $TiO_2$, $Si_3N_4$, and AlN, and mixtures thereof; the first layer comprises conductively doped polysilicon, and the third layer comprises elemental Ru which upon oxidation is transformed to $RuO_2$.

17. The method of forming a capacitor of claim 1 wherein the electrically conductive interconnect comprises TiN.

18. The method of forming a capacitor of claim 1 wherein the step of providing the electrically conductive interconnect comprises:

undercut etching the insulative barrier second layer selectively relative to the first and third layers to expose the first and third layers; and depositing a conformal electrically conductive layer over the exposed first and third layers for definition of the electrically conductive interconnect.

19. The method of forming a capacitor of claim 1 wherein the step of providing the electrically conductive interconnect occurs last in the stated claim 1 steps.

20. The method of forming a capacitor of claim 1 wherein the step of providing the electrically conductive interconnect occurs last in the stated claim 1 steps, and comprises:

undercut etching the insulative barrier second layer selectively relative to the first and third layers to expose the first and third layers; and depositing a conformal electrically conductive layer over the exposed first and third layers for definition of the electrically conductive interconnect.

21. A method of forming a capacitor comprising the following steps:

providing a node to which electrical connection to a capacitor is to be made;

forming an electrically conductive first layer over the node, the first layer comprising a material which is reactable to form an electrically insulating material;

forming an electrically insulative barrier second layer over the first conductive layer, the second layer comprising a composite of discrete layers of electrically insulative material, one of the discrete material layers restricting reaction of the first electrically conductive layer to an insulating material, and another of the discrete layers forming a diffusion barrier to out-diffusion of components of the first electrically conductive layer;

forming a third layer of electrically conductive material over the second electrically insulative layer;

forming an insulating inorganic metal oxide dielectric layer over the electrically conductive third layer, the insulating inorganic metal oxide dielectric layer comprising a ferroelectric material selected from the group consisting of titanates, zirconates, niobates, tantalates, and nitrates, and mixtures thereof;

forming an electrically conductive fourth layer over the insulating inorganic metal oxide dielectric layer; and forming an electrically conductive interconnect which extends over the second insulative layer and electrically interconnects the first and third conductive layers, and wherein the electrically conductive interconnect comprises TiN.

22. A method of forming a capacitor, comprising:

providing a node to which electrical connection is to be made;

forming a first conductively doped polysilicon layer over the node;

forming an electrically insulative barrier second layer over the first layer, the second layer comprising a composite of discrete layers of electrically insulative material selected from the groups consisting of $Al_2O_3$, $TiO_2$, $Si_3N_4$, $SiO_2$ and AlN and mixtures thereof, one of the discrete insulative material layers restricting reaction of the first conductively doped polysilicon layer to an insulating material, and another of the discrete layers forming a diffusion barrier to out-diffusion of components of the first conductively doped polysilicon layer;

forming a third layer of elemental platinum over the second electrically insulative layer;

forming an insulating inorganic metal oxide dielectric layer over the elemental platinum third layer, the insulating metal oxide dielectric layer selected from the group consisting of titanates, zirconates, niobates, tantalates, nitrates, and mixtures thereof;

forming an electrically conductive fourth layer over the insulating inorganic metal oxide dielectric layer; and forming an electrically conductive interconnect which extends over the electrically insulative barrier second layer and electrically interconnects the first conductively doped polysilicon layer with the third layer of elemental platinum, and wherein the electrically conductive interconnect comprises TiN.

23. A method of forming a capacitor, comprising;

providing a node to which electrical connection is to be made;

forming a first conductively doped polysilicon layer over the node;

forming an electrically insulative oxidation barrier second layer over the first layer, the second layer comprising a composite of discrete layers of electrically insulative material selected from the group consisting of $Al_2O_3$, $TiO_2$, $Si_3N_4$, $SiO_2$ and AlN and mixtures thereof, one of the discrete insulative material layers restricting reaction of the first conductively doped polysilicon layer to an insulating material and another of the discrete layers forming a diffusion barrier to out-diffusion of components of the first conductively doped polysilicon layer;

forming a third layer of $RuO_2$ over the second electrically insulative layer;

forming an insulating inorganic metal oxide dielectric layer over the third layer of $RuO_2$, the insulating inorganic metal oxide dielectric layer selected from the group consisting of titanates, zirconates, niobates, tantalates, nitrates, and mixtures thereof;

forming an electrically conductive fourth layer over the insulating inorganic metal oxide dielectric layer;

undercut etching the oxidation barrier second layer selectively relative to the first conductively doped polysilicon layer and the third layer of $RuO_2$ to expose the first and third layers; and depositing a conformed electrically conductive layer over the exposed first and third layers to form an electrically conductive interconnect and wherein the electrically conductive interconnect comprises TiN.

* * * * *

UNITED STATES PATENT AND TRADEMARK OFFICE
CERTIFICATE OF CORRECTION

PATENT NO. : 5,654,222
DATED : August 5, 1997
INVENTOR(S) : Sandhu et al.

It is certified that error appears in the above-indentified patent and that said Letters Patent is hereby corrected as shown below:

Col. 8 line 29, after the word "capacitor", insert the word -- plate --

Signed and Sealed this

Eighteenth Day of November 1997

Attest:

BRUCE LEHMAN

*Attesting Officer*     *Commissioner of Patents and Trademarks*